United States Patent
Syu et al.

(10) Patent No.: US 10,361,187 B1
(45) Date of Patent: Jul. 23, 2019

(54) ELECTROSTATIC DISCHARGE PROTECTION DEVICE

(71) Applicant: Maxchip Electronics Corp., Hsinchu (TW)

(72) Inventors: Ruei-Siang Syu, Hsinchu (TW); Wen-Chu Lo, Hsinchu (TW); Chih-Feng Lin, Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 15/975,791

(22) Filed: May 10, 2018

(30) Foreign Application Priority Data

Feb. 13, 2018 (TW) .............................. 107105108 A

(51) Int. Cl.
| | | |
|---|---|---|
| H01L 27/00 | (2006.01) |
| H01L 27/02 | (2006.01) |
| H01L 29/06 | (2006.01) |
| H01L 29/08 | (2006.01) |
| H01L 27/06 | (2006.01) |
| H01L 29/74 | (2006.01) |

(52) U.S. Cl.
CPC ...... H01L 27/0262 (2013.01); H01L 27/0255 (2013.01); H01L 27/0292 (2013.01); H01L 27/067 (2013.01); H01L 29/0692 (2013.01); H01L 29/0834 (2013.01); H01L 29/0839 (2013.01); H01L 29/7436 (2013.01)

(58) Field of Classification Search
None
See application file for complete search history.

(56) References Cited

U.S. PATENT DOCUMENTS

| | | | | |
|---|---|---|---|---|
| 5,272,097 A | * | 12/1993 | Shiota | H01L 27/0727 257/355 |
| 5,272,371 A | * | 12/1993 | Bishop | H01L 27/0251 257/361 |
| 5,327,319 A | * | 7/1994 | Lee | H02H 9/04 361/118 |
| 5,400,202 A | * | 3/1995 | Metz | H01L 27/0251 361/111 |

(Continued)

FOREIGN PATENT DOCUMENTS

| | | |
|---|---|---|
| TW | 201322409 | 6/2013 |
| TW | 201349450 | 12/2013 |
| TW | 201428927 | 7/2014 |

OTHER PUBLICATIONS

"Office Action of Taiwan Counterpart Application," dated Nov. 22, 2018, p. 1-p. 6.

(Continued)

*Primary Examiner* — Evren Seven
(74) *Attorney, Agent, or Firm* — JCIPRNET

(57) ABSTRACT

An electrostatic discharge (ESD) protection device including a silicon controlled rectifier and a diode string arranged along a first direction is provided. The silicon controlled rectifier includes an anode and a cathode disposed separately from each other. The anode and the cathode respectively include doped regions. The doped regions in the anode are arranged along a second direction. The doped regions in the cathode are arranged along the second direction. The first direction intersects the second direction.

20 Claims, 2 Drawing Sheets

(56) References Cited

U.S. PATENT DOCUMENTS

| | | | | |
|---|---|---|---|---|
| 5,430,595 A * | 7/1995 | Wagner | H01L 27/0251 | 257/355 |
| 5,452,171 A * | 9/1995 | Metz | H01L 27/0251 | 361/118 |
| 5,465,189 A * | 11/1995 | Polgreen | H01L 27/0259 | 257/357 |
| 5,550,699 A * | 8/1996 | Diaz | H02H 1/063 | 361/111 |
| 5,561,577 A * | 10/1996 | Motley | H01L 27/0251 | 361/111 |
| 5,591,661 A * | 1/1997 | Shiota | H01L 27/0255 | 257/E27.033 |
| 5,610,425 A * | 3/1997 | Quigley | H01L 27/0251 | 257/111 |
| 5,625,522 A * | 4/1997 | Watt | H01L 27/0251 | 361/111 |
| 5,671,111 A * | 9/1997 | Chen | H02H 9/046 | 361/111 |
| 5,728,612 A * | 3/1998 | Wei | H01L 27/0251 | 438/133 |
| 5,754,380 A * | 5/1998 | Ker | H01L 27/0251 | 257/E29.216 |
| 5,780,905 A * | 7/1998 | Chen | H01L 27/0262 | 257/355 |
| 5,781,388 A * | 7/1998 | Quigley | H01L 27/0251 | 361/111 |
| 5,821,572 A * | 10/1998 | Walker | H01L 27/0262 | 257/107 |
| 5,869,873 A * | 2/1999 | Yu | H02H 9/046 | 257/355 |
| 5,872,378 A * | 2/1999 | Rose | H01L 27/0248 | 257/324 |
| 5,877,927 A * | 3/1999 | Parat | H01L 27/0251 | 361/56 |
| 5,907,462 A * | 5/1999 | Chatterjee | H01L 29/87 | 361/111 |
| 5,959,488 A * | 9/1999 | Lin | H01L 27/0251 | 327/313 |
| 5,959,821 A * | 9/1999 | Voogel | H01L 27/0251 | 361/111 |
| 5,978,192 A * | 11/1999 | Young | H02H 9/046 | 361/111 |
| 5,982,601 A * | 11/1999 | Lin | H01L 27/0262 | 361/111 |
| 6,002,567 A * | 12/1999 | Zou | H01L 27/0248 | 361/111 |
| 6,069,782 A * | 5/2000 | Lien | H01L 27/0248 | 361/111 |
| 6,125,021 A * | 9/2000 | Duvvury | H01L 27/0266 | 361/56 |
| 6,157,530 A * | 12/2000 | Pequignot | H01L 27/0248 | 361/111 |
| 6,233,130 B1 * | 5/2001 | Lin | H01L 27/0251 | 361/111 |
| 6,304,127 B1 * | 10/2001 | Lin | H01L 27/0251 | 327/321 |
| 6,411,485 B1 * | 6/2002 | Chen | H01L 27/0255 | 361/111 |
| 6,768,616 B2 | 7/2004 | Mergens et al. | | |
| 7,027,278 B1 * | 4/2006 | Vashchenko | H01L 27/0259 | 361/56 |
| 7,087,938 B2 * | 8/2006 | Streibl | H01L 27/0259 | 257/173 |
| 7,106,562 B2 * | 9/2006 | Kitagawa | H01L 27/0251 | 361/56 |
| 7,342,281 B2 * | 3/2008 | Kim | H01L 29/7436 | 257/107 |
| 7,352,014 B2 | 4/2008 | Van Camp | | |
| 7,385,793 B1 * | 6/2008 | Ansel | H02H 9/046 | 361/111 |
| 7,405,435 B2 * | 7/2008 | Sato | H01L 27/0262 | 257/173 |
| 7,408,754 B1 * | 8/2008 | O | H01L 27/0262 | 361/91.1 |
| 7,440,248 B2 * | 10/2008 | Arai | H01L 27/0262 | 361/111 |
| 7,672,101 B2 * | 3/2010 | Lin | H01L 27/0266 | 361/111 |
| 7,709,896 B2 * | 5/2010 | Russ | H01L 29/0626 | 257/355 |
| 7,714,356 B2 * | 5/2010 | Abou-Khalil | H01L 27/0259 | 257/173 |
| 7,746,610 B2 * | 6/2010 | Choi | H02H 9/046 | 361/56 |
| 7,773,442 B2 * | 8/2010 | Kapre | G11C 5/14 | 326/21 |
| 7,791,851 B1 * | 9/2010 | Luquette | H01L 27/0266 | 361/111 |
| 7,800,128 B2 * | 9/2010 | Domanski | H01L 27/0262 | 257/173 |
| 7,826,185 B2 * | 11/2010 | Abou-Khalil | H01L 27/0262 | 361/118 |
| 7,859,807 B2 * | 12/2010 | Wang | H01L 27/0255 | 361/56 |
| 8,120,887 B2 * | 2/2012 | Mallikararjunaswamy | H01L 27/0262 | 361/111 |
| 8,134,211 B2 * | 3/2012 | Manna | H01L 27/0262 | 257/355 |
| 8,243,403 B2 * | 8/2012 | Liang | H01L 27/0285 | 361/111 |
| 8,247,839 B2 * | 8/2012 | Van Wijmeersch | H01L 27/0262 | 257/107 |
| 8,283,698 B2 * | 10/2012 | Sorgeloos | H01L 27/0259 | 257/173 |
| 8,368,116 B2 * | 2/2013 | Salcedo | H01L 27/0259 | 257/173 |
| 8,373,956 B2 * | 2/2013 | Abou-Khalil | H02H 9/046 | 361/118 |
| 8,427,796 B2 * | 4/2013 | Worley | H03F 1/52 | 361/56 |
| 8,432,651 B2 * | 4/2013 | Salcedo | H01L 23/60 | 257/355 |
| 8,456,785 B2 * | 6/2013 | Domanski | H01L 27/0262 | 361/56 |
| 8,466,489 B2 * | 6/2013 | Salcedo | H01L 27/0262 | 257/120 |
| 8,466,663 B2 * | 6/2013 | Kaufmann | H02M 3/33523 | 323/220 |
| 8,467,162 B2 * | 6/2013 | Wang | H01L 27/0262 | 361/111 |
| 8,592,860 B2 * | 11/2013 | Salcedo | H01L 21/8222 | 257/140 |
| 8,610,251 B1 * | 12/2013 | Salcedo | H01L 29/747 | 257/173 |
| 8,637,899 B2 * | 1/2014 | Salcedo | H01L 27/0262 | 257/173 |
| 8,665,571 B2 * | 3/2014 | Salcedo | H02H 9/046 | 361/118 |
| 8,675,322 B2 * | 3/2014 | Wang | H02H 9/046 | 361/56 |
| 8,680,620 B2 * | 3/2014 | Salcedo | H01L 27/0262 | 257/355 |
| 8,693,149 B2 * | 4/2014 | Ball | H01L 27/0285 | 361/56 |
| 8,730,634 B2 * | 5/2014 | Tsai | H02H 9/046 | 361/111 |
| 8,749,931 B2 * | 6/2014 | Tsai | H01L 27/027 | 361/118 |
| 8,796,729 B2 * | 8/2014 | Clarke | H01L 29/0692 | 257/109 |
| 8,829,570 B2 * | 9/2014 | Parthasarathy | H01L 27/0262 | 257/197 |
| 8,860,080 B2 * | 10/2014 | Salcedo | H01L 29/78 | 257/140 |
| 8,907,395 B2 | 12/2014 | Hsu et al. | | |

(56) References Cited

U.S. PATENT DOCUMENTS

| | | | | |
|---|---|---|---|---|
| 8,929,039 B2* | 1/2015 | Bajaj | ...................... | H02H 9/046 361/111 |
| 8,946,822 B2* | 2/2015 | Salcedo | .............. | H01L 27/0259 257/355 |
| 8,947,841 B2* | 2/2015 | Salcedo | ................. | H01L 23/60 361/111 |
| 9,006,781 B2* | 4/2015 | Salcedo | .............. | H01L 27/0262 257/140 |
| 9,054,521 B2* | 6/2015 | Huo | ....................... | H02H 9/046 |
| 9,123,540 B2* | 9/2015 | Salcedo | .............. | H01L 29/7436 |
| 9,147,677 B2* | 9/2015 | Salcedo | .............. | H01L 27/0262 |
| 9,171,832 B2* | 10/2015 | Salcedo | .............. | H01L 29/7436 |
| 9,275,991 B2* | 3/2016 | Salcedo | .............. | H01L 27/0921 |
| 9,438,033 B2* | 9/2016 | Parthasarathy | ........ | H02H 9/005 |
| 9,478,608 B2* | 10/2016 | Salcedo | .............. | H01L 29/0646 |
| 9,484,739 B2* | 11/2016 | Coyne | ................. | H01L 27/0259 |
| 9,594,172 B1* | 3/2017 | Karunasiri | ................ | G01T 1/24 |
| 9,673,187 B2* | 6/2017 | Salcedo | .............. | H01L 27/0259 |
| 9,685,431 B2* | 6/2017 | Sorgeloos | ........... | H01L 29/7436 |
| 9,831,233 B2* | 11/2017 | Salcedo | ................. | H01L 24/49 |
| 9,831,234 B2* | 11/2017 | Lee | ...................... | H01L 29/7436 |
| 9,842,629 B2* | 12/2017 | Kapre | ...................... | G11C 5/14 |
| 10,043,792 B2* | 8/2018 | Coyne | ................. | H01L 27/0259 |
| 10,068,894 B2* | 9/2018 | Zhao | ................... | H01L 21/8222 |
| 10,181,719 B2* | 1/2019 | Coyne | ................... | H02H 9/041 |
| 10,199,482 B2* | 2/2019 | Clarke | ................ | H01L 27/0259 |
| 10,249,609 B2* | 4/2019 | Salcedo | .............. | H01L 27/0262 |

OTHER PUBLICATIONS

Meng Miao et al."Minimizing Multiple Triggering Effect in Diode-Triggered Silicon-Controlled Rectifiers for ESD Protection Applications",IEEE Electron Device Letters, vol. 33, No. 6, May 4, 2012,pp. 893-895.

* cited by examiner

ELECTROSTATIC DISCHARGE PROTECTION DEVICE

CROSS-REFERENCE TO RELATED APPLICATION

This application claims the priority benefit of Taiwan application serial no. 107105108, filed on Feb. 13, 2018. The entirety of the above-mentioned patent application is hereby incorporated by reference herein and made a part of this specification.

BACKGROUND OF THE INVENTION

Field of the Invention

The invention relates to a semiconductor structure, and particularly relates to an electrostatic discharge protection device.

Description of Related Art

Electrostatic discharge (ESD) is a phenomenon that charges accumulate on a non-conductor or an ungrounded conductor and then rapidly move and discharge through a discharge path in a short time. The electrostatic discharge may cause circuit damage in an integrated circuit, so that an electrostatic discharge protection device is usually provided in a semiconductor device to prevent the damage caused by the electrostatic discharge.

However, the current electrostatic discharge protection device has a larger layout area. Therefore, how to effectively reduce the layout area of the electrostatic discharge protection device is a problem that needs to be solved currently.

SUMMARY OF THE INVENTION

The invention provides an electrostatic discharge protection device, the area of which can be significantly reduced.

The invention provides an electrostatic discharge protection device including a silicon controlled rectifier and a diode string arranged along a first direction. The silicon controlled rectifier includes an anode and a cathode disposed separately from each other. The anode and the cathode respectively include doped regions. The doped regions in the anode are arranged along a second direction. The doped regions in the cathode are arranged along the second direction. The first direction intersects the second direction.

According to an embodiment of the invention, in the electrostatic discharge protection device, the anode may be located between the cathode and the diode string.

According to an embodiment of the invention, in the electrostatic discharge protection device, the doped regions in the anode may be disposed separately from each other, and the doped regions in the cathode may be disposed separately from each other.

According to an embodiment of the invention, in the electrostatic discharge protection device, the doped regions in the anode may include at least one first N-type doped region and at least one first P-type doped region. The doped regions in the cathode may include at least one second N-type doped region and at least one second P-type doped region.

According to an embodiment of the invention, in the electrostatic discharge protection device, the first N-type doped region and the first P-type doped region may be coupled to each other. The second N-type doped region and the second P-type doped region may be coupled to each other.

According to an embodiment of the invention, in the electrostatic discharge protection device, in the anode, a total area of the first P-type doped region may be larger than a total area of the first N-type doped region.

According to an embodiment of the invention, in the electrostatic discharge protection device, in the anode, a ratio of the total area of the first P-type doped region to a total area of the first N-type doped region and the first P-type doped region may be larger than 50% and less than or equal to 70%.

According to an embodiment of the invention, in the electrostatic discharge protection device, in the cathode, a total area of the second N-type doped region may be larger than a total area of the second P-type doped region.

According to an embodiment of the invention, in the electrostatic discharge protection device, in the cathode, a ratio of the total area of the second N-type doped region to a total area of the second N-type doped region and the second P-type doped region may be larger than 50% and less than or equal to 70%.

According to an embodiment of the invention, in the electrostatic discharge protection device, the silicon controlled rectifier may further include an N-type well region and a P-type well region. The doped regions in the anode are located in the N-type well region. The doped regions in the cathode are located in the P-type well region.

According to an embodiment of the invention, in the electrostatic discharge protection device, the diode string may include diodes connected in series. The diodes are arranged along the second direction.

According to an embodiment of the invention, in the electrostatic discharge protection device, the diodes may respectively include an N-type doped region and a P-type doped region.

According to an embodiment of the invention, in the electrostatic discharge protection device, the N-type doped region and the P-type doped region may be disposed separately from each other.

According to an embodiment of the invention, in the electrostatic discharge protection device, the diode string may further include N-type well regions. The diodes may be respectively located in the N-type well regions.

According to an embodiment of the invention, in the electrostatic discharge protection device, the silicon controlled rectifier may be coupled to the diode string.

According to an embodiment of the invention, in the electrostatic discharge protection device, the anode of the silicon controlled rectifier may be coupled to an input terminal of the diode string. The cathode of the silicon controlled rectifier may be coupled to an output terminal of the diode string.

The invention provides another electrostatic discharge protection device including a silicon controlled rectifier and a diode string arranged along a first direction. The diode string includes diodes connected in series. The diodes are arranged along a second direction. The first direction intersects the second direction.

According to another embodiment of the invention, in the electrostatic discharge protection device, the diodes may respectively include an N-type doped region and a P-type doped region.

According to another embodiment of the invention, in the electrostatic discharge protection device, the diode string may further include N-type well regions. The diodes are respectively located in the N-type well regions.

According to another embodiment of the invention, in the electrostatic discharge protection device, the silicon controlled rectifier may be coupled to the diode string.

Based on the above, in the electrostatic discharge protection device provided by an embodiment of the invention, the silicon controlled rectifier and the diode string are arranged along the first direction. In the silicon controlled rectifier, the doped regions in the anode are arranged along the second direction, the doped regions in the cathode are arranged along the second direction, and the first direction intersects the second direction. Thereby, the layout area of the electrostatic discharge protection device may be significantly reduced, so as to have a better electrostatic discharge protection effect.

Additionally, in the electrostatic discharge protection device provided by another embodiment of the invention, the silicon controlled rectifier and the diode string are arranged along the first direction. The diodes in the diode string are arranged along the second direction, and the first direction intersects the second direction. Thereby, the layout area of the electrostatic discharge protection device may be significantly reduced, so as to have the better electrostatic discharge protection effect.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
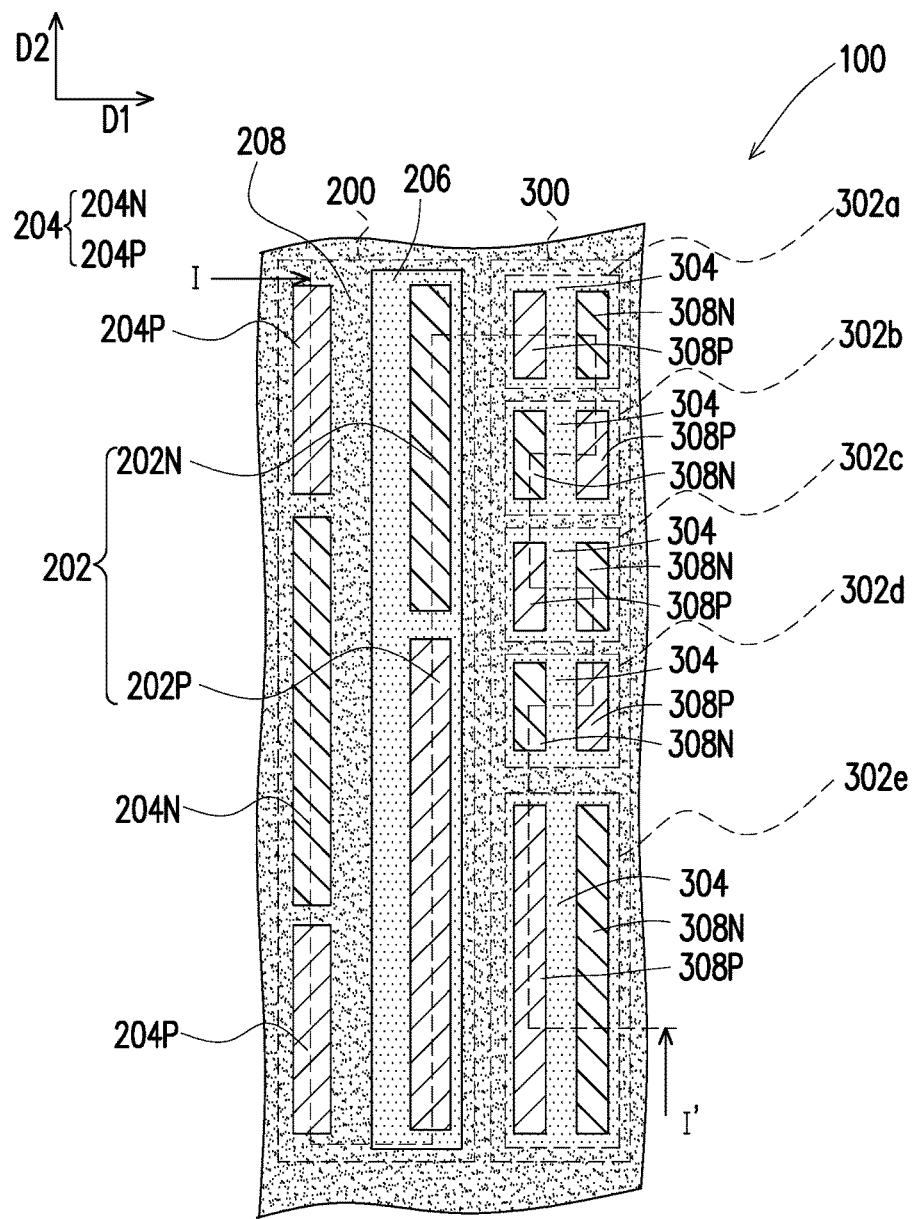
FIG. 1 is a top view of an electrostatic discharge protection device according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
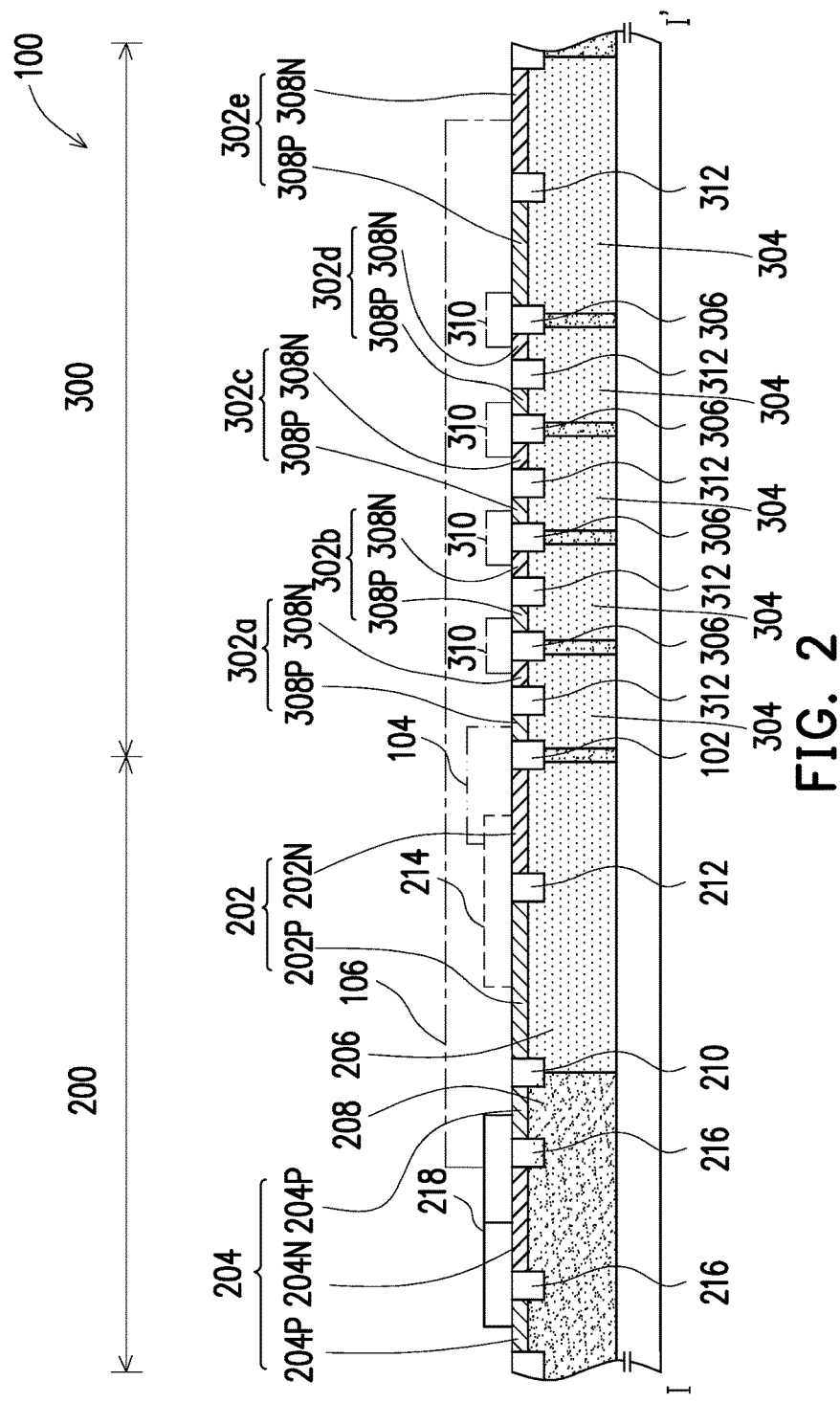
FIG. 2 is a cross-sectional view of the electrostatic discharge protection device taken along a section line I-I' in FIG. 1.

FIG. 1 is a top view of an electrostatic discharge protection device according to an embodiment of the invention. In FIG. 1, in order to clearly illustrate a relationship between components, isolation structures and interconnect structures are not shown. FIG. 2 is a cross-sectional view of the electrostatic discharge protection device taken along a section line I-I' in FIG. 1.

Referring to FIG. 1 and FIG. 2, an electrostatic discharge protection device 100 includes a silicon controlled rectifier 200 and a diode string 300 arranged along a first direction D1. The first direction D1 intersects a second direction D2. The silicon controlled rectifier 200 and the diode string 300 may be disposed separately from each other by an isolation structure 102. The isolation structure 102 is a shallow trench isolation (STI) structure, for example.

The silicon controlled rectifier 200 includes an anode 202 and a cathode 204 disposed separately from each other, and may further include an N-type well region 206 and a P-type well region 208. The anode 202 may be located between the cathode 204 and the diode string 300, but the invention is not limited thereto. For instance, the anode 202 and the cathode 204 may be disposed separately from each other by an isolation structure 210. The isolation structure 210 is a shallow trench isolation structure, for example.

The anode 202 includes doped regions, such as an N-type doped region 202N and a P-type doped region 202P. The doped regions in the anode 202 are arranged along the second direction D2. Thereby, the layout area can be significantly reduced. The doped regions in the anode 202 may be disposed separately from each other. The doped regions in the anode 202 may be located in the N-type well region 206. For instance, the doped regions in the anode 202 may include at least one N-type doped region 202N and at least one P-type doped region 202P. In the embodiment, it is illustrated that the doped regions in the anode 202 includes one N-type doped region 202N and one P-type doped region 202P as an example, but the invention is not limited thereto. In other embodiments, a person skilled in the art may adjust the number of the N-type doped region 202N and the P-type doped region 202P according to the product requirements.

The N-type doped region 202N and the P-type doped region 202P are arranged along the second direction D2. The N-type doped region 202N and the P-type doped region 202P may be located in the N-type well region 206. The N-type doped region 202N and the P-type doped region 202P may be disposed separately from each other by an isolation structure 212. The isolation structure 212 is a shallow trench isolation structure, for example. Additionally, the N-type doped region 202N and the P-type doped region 202P may be coupled to each other by an interconnect structure 214. The interconnect structure 214 may be a wire, a contact, a via, or a combination thereof.

In the anode 202, a total area of the P-type doped region 202P may be larger than a total area of the N-type doped region 202N. For instance, a ratio of the total area of the P-type doped region 202P to a total area of the N-type doped region 202N and the P-type doped region 202P may be larger than 50% and less than or equal to 70%, such as 60%.

The cathode 204 includes doped regions, such as an N-type doped region 204N and a P-type doped region 204P. The doped regions in the cathode 204 are arranged along the second direction D2. Thereby, the layout area can be significantly reduced. The doped regions in the cathode 204 may be disposed separately from each other. The doped regions in the cathode 204 may be located in the P-type well region 208. For instance, the doped regions in the cathode 204 may include at least one N-type doped region 204N and at least one P-type doped region 204P. In the embodiment, it is illustrated that the doped regions in the cathode 204 includes one N-type doped region 204N and two P-type doped regions 204P as an example, but the invention is not limited thereto. In other embodiments, a person skilled in the art may adjust the number of the N-type doped region 204N and the P-type doped region 204P according to the product requirements.

The N-type doped region 204N and the P-type doped regions 204P are arranged along the second direction D2. The N-type doped region 204N and the P-type doped regions 204P may be located in the P-type well region 208. The N-type doped region 204N and the P-type doped regions 204P may be disposed separately from each other by an isolation structure 216. The isolation structure 216 is a shallow trench isolation structure, for example. Additionally, the N-type doped region 204N and the P-type doped regions 204P may be coupled to each other by an interconnect structure 218. The interconnect structure 218 may be a wire, a contact, a via, or a combination thereof.

In the cathode 204, a total area of the N-type doped region 204N may be larger than a total area of the P-type doped regions 204P. For instance, a ratio of the total area of the N-type doped region 204N to a total area of the N-type doped region 204N and the P-type doped regions 204P may be larger than 50% and less than or equal to 70%, such as 60%.

The diode string 300 may include diodes 302a-302e connected in series, and may further include N-type well regions 304. The diodes 302a-302e may be respectively located in the N-type well regions 304. The diodes 302a-302e are arranged along the second direction D2. The diodes 302a-302e may be disposed separately from each other by an isolation structure 306. The isolation structure 306 is a shallow trench isolation structure, for example. In the embodiment, it is illustrated that a number of the diodes in the diode string 300 is five as an example, but the invention is not limited thereto. As long as the diode string 300 includes diodes connected in series, it falls within the scope of the invention.

The diodes 302a-302e may respectively include an N-type doped region 308N and a P-type doped region 308P. In the diodes 302a-302e of the diode string 300, the diode 302e located at an output terminal of the diode string 300 may have the largest area. The N-type doped region 308N and the P-type doped region 308P may be respectively located in the N-type well regions 304. The serial connection method of the diodes 302a-302e is to couple to each other by an interconnect structure 310, for example. For instance, the doped region 308N in the diode 302a and the doped region 308P in the diode 302b may be coupled by the interconnect structure 310, such that the diode 302a and the diode 302b are connected to each other in series. The interconnect structure 310 may be a wire, a contact, a via, or a combination thereof. The N-type doped region 308N and the P-type doped region 308P may be disposed separately from each other by an isolation structure 312. The isolation structure 312 is a shallow trench isolation structure, for example.

The silicon controlled rectifier 200 may be coupled to the diode string 300. The anode 202 of the silicon controlled rectifier 200 may be coupled to an input terminal of the diode string 300, such as the P-type doped region 308P of the diode 302a. The cathode 204 of the silicon controlled rectifier 200 may be coupled to the output terminal of the diode string 300, such as the N-type doped region 308N of the diode 302e. For instance, the anode 202 of the silicon controlled rectifier 200 may be coupled to the P-type doped region 308P of the diode 302a (the input terminal of the diode string 300) by the interconnect structure 104, and the cathode 204 of the silicon controlled rectifier 200 may be coupled to the N-type doped region 308N of the diode 302e (the output terminal of the diode string 300) by the interconnect structure 106. Each of the interconnect structures 104 and 106 may be a wire, a contact, a via, or a combination thereof respectively.

In the embodiment, the electrostatic discharge protection device 100 is illustrated using the layout manner of the silicon controlled rectifier 200 and the layout manner of the diode string 300 above at the same time as an example, but the invention is not limited thereto. In other embodiments, as long as the electrostatic discharge protection device uses at least one of the layout manner of the silicon controlled rectifier 200 and the layout manner of the diode string 300 above, the purpose of reducing the layout area can be achieved, which falls within the scope of the invention.

Based on the embodiments above, in the electrostatic discharge protection device 100 provided by an embodiment of the invention, the silicon controlled rectifier 200 and the diode string 300 are arranged along the first direction D1. In the silicon controlled rectifier 200, the doped regions in the anode 202 are arranged along the second direction D2, the doped regions in the cathode 204 are arranged along the second direction D2, and the first direction D1 intersects the second direction D2. Thereby, the layout area of the electrostatic discharge protection device 100 may be significantly reduced, so as to have the better electrostatic discharge protection effect.

Additionally, in the electrostatic discharge protection device 100 provided by another embodiment of the invention, the silicon controlled rectifier 200 and the diode string 300 are arranged along the first direction D1. The diodes in the diode string 300 are arranged along the second direction D2, and the first direction D1 intersects the second direction D2. Thereby, the layout area of the electrostatic discharge protection device 100 may be significantly reduced, so as to have the better electrostatic discharge protection effect.

Additionally, in the electrostatic discharge protection device 100 provided by yet another embodiment of the invention, the layout manner of the silicon controlled rectifier 200 and the layout manner of the diode string 300 above may be used at the same time, so as to further reduce the layout area of the electrostatic discharge protection device 100 and further improve the electrostatic discharge protection effect.

In summary, the electrostatic discharge protection device of the embodiment above may reduce the layout area by the specific layout manner, so as to improve the electrostatic discharge protection effect.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electrostatic discharge protection device, comprising a silicon controlled rectifier and a diode string arranged along a first direction, wherein
the silicon controlled rectifier comprises an anode and a cathode disposed separately from each other,
the anode and the cathode respectively comprise doped regions,
the doped regions in the anode are arranged along a second direction,
the doped regions in the cathode are arranged along the second direction, and
the first direction intersects the second direction.

2. The electrostatic discharge protection device according to claim 1, wherein the anode is located between the cathode and the diode string.

3. The electrostatic discharge protection device according to claim 1, wherein the doped regions in the anode are disposed separately from each other, and the doped regions in the cathode are disposed separately from each other.

4. The electrostatic discharge protection device according to claim 1, wherein
the doped regions in the anode comprise at least one first N-type doped region and at least one first P-type doped region, and
the doped regions in the cathode comprise at least one second N-type doped region and at least one second P-type doped region.

5. The electrostatic discharge protection device according to claim 4, wherein the at least one first N-type doped region and the at least one first P-type doped region are coupled to each other, and the at least one second N-type doped region and the at least one second P-type doped region are coupled to each other.

6. The electrostatic discharge protection device according to claim 4, wherein in the anode, a total area of the at least one first P-type doped region is larger than a total area of the at least one first N-type doped region.

7. The electrostatic discharge protection device according to claim 6, wherein in the anode, a ratio of the total area of the at least one first P-type doped region to a total area of the at least one first N-type doped region and the at least one first P-type doped region is larger than 50% and less than or equal to 70%.

8. The electrostatic discharge protection device according to claim 4, wherein in the cathode, a total area of the at least one second N-type doped region is larger than a total area of the at least one second P-type doped region.

9. The electrostatic discharge protection device according to claim 8, wherein in the cathode, a ratio of the total area of the at least one second N-type doped region to a total area of the at least one second N-type doped region and the at least one second P-type doped region is larger than 50% and less than or equal to 70%.

10. The electrostatic discharge protection device according to claim 1, wherein the silicon controlled rectifier further comprises:
an N-type well region, wherein the doped regions in the anode are located in the N-type well region; and
a P-type well region, wherein the doped regions in the cathode are located in the P-type well region.

11. The electrostatic discharge protection device according to claim 1, wherein the diode string comprises diodes connected in series, wherein the diodes are arranged along the second direction.

12. The electrostatic discharge protection device according to claim 11, wherein the diodes respectively comprise an N-type doped region and a P-type doped region.

13. The electrostatic discharge protection device according to claim 12, wherein the N-type doped region and the P-type doped region are disposed separately from each other.

14. The electrostatic discharge protection device according to claim 11, wherein the diode string further comprises N-type well regions, wherein the diodes are respectively located in the N-type well regions.

15. The electrostatic discharge protection device according to claim 1, wherein the silicon controlled rectifier is coupled to the diode string.

16. The electrostatic discharge protection device according to claim 15, wherein the anode of the silicon controlled rectifier is coupled to an input terminal of the diode string, and the cathode of the silicon controlled rectifier is coupled to an output terminal of the diode string.

17. An electrostatic discharge protection device, comprising a silicon controlled rectifier and a diode string arranged along a first direction, wherein
the diode string comprises diodes connected in series,
the diodes are arranged along a second direction, and
the first direction intersects the second direction.

18. The electrostatic discharge protection device according to claim 17, wherein the diodes respectively comprise an N-type doped region and a P-type doped region.

19. The electrostatic discharge protection device according to claim 17, wherein the diode string further comprises N-type well regions, wherein the diodes are respectively located in the N-type well regions.

20. The electrostatic discharge protection device according to claim 17, wherein the silicon controlled rectifier is coupled to the diode string.

* * * * *